(12) United States Patent
Levin et al.

(10) Patent No.: US 10,107,844 B2
(45) Date of Patent: Oct. 23, 2018

(54) ANTENNAS WITH UNIQUE ELECTRONIC SIGNATURE

(71) Applicant: Telefonaktiebolaget L M Ericsson (publ), Stockholm (SE)

(72) Inventors: Georgy Levin, Ottawa (CA); James H. K. Sanderson, Ottawa (CA)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 285 days.

(21) Appl. No.: 13/763,784

(22) Filed: Feb. 11, 2013

(65) Prior Publication Data

US 2014/0225790 A1   Aug. 14, 2014

(51) Int. Cl.

| | |
|---|---|
| *G01R 29/10* | (2006.01) |
| *H04W 24/06* | (2009.01) |
| *H04W 24/00* | (2009.01) |
| *H04W 24/02* | (2009.01) |
| *H04W 24/04* | (2009.01) |
| *H04B 1/38* | (2015.01) |
| *H04W 24/08* | (2009.01) |

(Continued)

(52) U.S. Cl.
CPC ............ *G01R 29/10* (2013.01); *H01Q 3/267* (2013.01); *H04B 1/38* (2013.01); *H04B 17/103* (2015.01); *H04W 24/00* (2013.01); *H04W 24/02* (2013.01); *H04W 24/04* (2013.01); *H04W 24/06* (2013.01); *H04W 24/08* (2013.01)

(58) Field of Classification Search
CPC .... H01Q 3/267; G01R 29/10; G06K 7/10138; H04W 24/00; H04W 24/02; H04W 24/04; H04W 24/06; H04W 24/08; H04B 17/103; H04B 1/38

USPC ...... 343/702, 703; 455/423, 424, 425, 67.11
See application file for complete search history.

(56) References Cited

U.S. PATENT DOCUMENTS 3,375,518 A     3/1968  Mader et al.
5,198,821 A *  3/1993  Skrzypczak ........... G01R 29/10
                                                                342/360

(Continued)

FOREIGN PATENT DOCUMENTS

CN         1329398 A      1/2002
DE    102004042160 A1    3/2006

(Continued)

OTHER PUBLICATIONS

Hines, M. et al. "Time-Domain Oscillographic Microwave Network Analysis Using Frequency-Domain Data." IEEE Transactions on Microwave Theory and Techniques, vol. MTT-22, No. 3, Mar. 1974, pp. 276-282.

(Continued)

*Primary Examiner* — Dameon E Levi
*Assistant Examiner* — Ab Salam Alkassim, Jr.
(74) *Attorney, Agent, or Firm* — Coats & Bennett, PLLC

(57) ABSTRACT

Methods and apparatus are disclosed for manufacturing antennas with a unique signature and for identifying an antenna using its unique signature. An exemplary antenna comprises a radiating element and a ground element, between which a resistor-inductor-capacitor (RLC) circuit is connected. The RLC circuit is designed to generate a return-loss profile that serves as a unique antenna signature. The return-loss profile of the RLC circuit exhibits a resonance frequency outside the antenna's working bandwidth.

2 Claims, 6 Drawing Sheets

(51) Int. Cl.
*H01Q 3/26* (2006.01)
*H04B 17/10* (2015.01)

(56) References Cited

U.S. PATENT DOCUMENTS

| | | | |
|---|---|---|---|
| 5,458,123 A | 10/1995 | Unger | |
| 5,471,146 A * | 11/1995 | Krayeski | H04B 17/318 324/637 |
| 6,496,153 B2 | 12/2002 | Boulesteix | |
| 6,574,454 B1 | 6/2003 | Tuttle | |
| 6,594,508 B1 * | 7/2003 | Ketonen | G01R 29/10 455/422.1 |
| 6,842,614 B2 * | 1/2005 | Noe | H04W 24/00 455/115.1 |
| 6,853,197 B1 | 2/2005 | McFarland et al. | |
| 6,891,466 B2 | 5/2005 | Turner et al. | |
| 7,042,406 B2 * | 5/2006 | McFarland | H01Q 1/242 343/703 |
| 7,639,204 B2 * | 12/2009 | Chau | 343/905 |
| 7,830,327 B2 | 11/2010 | He | |
| 7,865,145 B2 * | 1/2011 | Neustadt | H04B 17/318 455/161.3 |
| 7,880,681 B2 | 2/2011 | Rentz et al. | |
| 8,099,064 B2 * | 1/2012 | Zhu | H01Q 1/2241 455/114.2 |
| 9,087,247 B2 * | 7/2015 | Bellows | G06K 7/10386 |
| 2003/0162539 A1 * | 8/2003 | Fiut | H04W 24/00 455/424 |
| 2004/0203543 A1 * | 10/2004 | Regev | H04B 1/0458 455/127.1 |
| 2007/0258483 A1 * | 11/2007 | Tolaio | H04W 24/06 370/467 |
| 2007/0258484 A1 * | 11/2007 | Tolaio | H04L 43/50 370/467 |
| 2007/0259625 A1 * | 11/2007 | Tolaio | G01R 27/28 455/67.11 |
| 2008/0094294 A1 * | 4/2008 | Apostolos | H01Q 3/267 343/703 |
| 2008/0122712 A1 | 5/2008 | Chen | |
| 2009/0149173 A1 * | 6/2009 | Tolaio | H04W 24/06 455/424 |
| 2011/0105023 A1 * | 5/2011 | Scheer | H01Q 1/242 455/41.2 |
| 2012/0142277 A1 * | 6/2012 | Vermette | H01Q 1/28 455/67.14 |
| 2012/0281530 A1 * | 11/2012 | Sambhwani | H04W 28/0284 370/230 |
| 2016/0012704 A1 * | 1/2016 | McDonald | F16L 1/11 340/686.6 |
| 2017/0264010 A1 * | 9/2017 | Shi | H01Q 1/50 |

FOREIGN PATENT DOCUMENTS

| | | |
|---|---|---|
| EP | 1863123 A1 | 12/2007 |
| EP | 1962374 A1 | 8/2008 |
| TW | 1223507 B | 11/2004 |

OTHER PUBLICATIONS

Furse, C. et al. "Frequency-Domain Reflectometery for on-Board Testing of Aging Aircraft Wiring." IEEE Transactions on Electromagnetic Compatibility, vol. 45, No. 2, May 2003, pp. 306-315.

Smith, P. et al. "Analysis of Spread Spectrum Time Domain Reflectometry for Wire Fault Location." IEEE Sensors Journal, vol. 5, No. 6, Dec. 2005, pp. 1469-1478.

Furse, C. et al. "A critical comparison for reflectometry methods for location of wiring faults." Smart Structures and Systems, vol. 2, No. 1, 2006, pp. 25-46.

Lo, C. et al. "Noise-Domain Reflectometry for Locating Wiring Faults." IEEE Transactions on Electromagnetic Compatibility, vol. 47, No. 1, Feb. 2005, pp. 97-104.

Olmon, R. et al. "Antenna-load interactions at optical frequencies: impedance matching to quantum systems." Nanotechnology 23 (2012) 444001—Topical Review, Oct. 18, 2012, pp. 1-28.

Séguin, G. et al. "Antenna Signature Test Using Near-Field Measurement." IEEE Antennas and Propagation Society International Symposium, 1997 Digest, vol. 1, Jul. 13-18, 1997, pp. 172-175.

* cited by examiner

ANTENNAS WITH UNIQUE ELECTRONIC SIGNATURE

TECHNICAL FIELD

The present invention relates generally to antennas used in a wireless transceiver, and more specifically to identifying an antenna using its unique electronic signature.

BACKGROUND

Marking or identifying the source or manufacturer of an antenna has generally relied on the antenna's outward features, such as shape, size, color, and package, or through the use of a trademark or a trade dress. Such features or designs may disappear due to wear and tear as time passes, making identification of the source or manufacturer of an antenna difficult. Further, an antenna used in the field, for example, installed on the top of a wireless tower, does not allow easy access for close inspection of the antenna type.

Reflectometry is a measurement technique that has been widely used to diagnose problems associated with radio frequency (RF) antennas or an electronic circuit or device. For example, reflectometry can be used to detect fault, locate disruption, and calibrate distance in a test circuit. Reflectometry includes time-domain, frequency domain, and noise domain analysis. In reflectometry, a test signal, often a wideband or swept-frequency signal, is sent into an electronic circuit or device and a reflected signal is measured at an antenna interface port. Besides reflectometry, transmissometry is another diagnostic tool. But unlike reflectometry that measures a reflected signal, transmissometry measures a transmitted signal.

To detect a faulty antenna, reflectometry measures a maximum return loss and/or a minimum return loss of an antenna. A return loss of a device measures the ratio of an output signal power to an input signal power in decibel. Abnormal maximum/minimum return losses can be useful in detecting an antenna that is not working properly, for example, reflecting signals excessively. However, for working antennas, the measured maximum/minimum return losses are generally within a normal range and do not possess unique features that are suitable for identification purposes. Other than the maximum/minimum return loss, a working antenna generally exhibits random electric behavior, therefore does not have an electronic "signature."

The present application discloses advantageous methods and devices that can be used to electronically mark and identify an antenna.

SUMMARY

Low-cost and energy efficient methods and apparatus are disclosed for electronically marking and identifying an antenna. Methods and apparatus for automatically and remotely identifying an antenna type are also disclosed. The methods and apparatus disclosed herein use a resistor-inductor-capacitor (RLC) circuit designed to generate a return-loss-profile that can serve as a unique antenna signature of the antenna.

In some embodiments, an antenna manufactured with a unique antenna signature comprises a radiating element, a ground element and an RLC circuit. The radiating element is configured to transmit and receive radio frequency signals. The ground element is connected to the ground. The RLC circuit is connected between the radiating element and the ground element and is configured such that it generates a return-loss profile having a distinctive resonant frequency that is outside the working bandwidth of the antenna. By measuring the return-loss-profile of the antenna equipped with such RLC circuit, the distinctive resonant frequency can be identified and can serve as the unique signature of the antenna.

Some embodiments comprise an apparatus for identifying an antenna as disclosed. An exemplary apparatus for identifying a unique antenna signature of an antenna comprises a transmitter, a coupler and an evaluation circuit. An evaluation circuit further comprises a receiver, a return-to-loss profile detector, a correlator, and an identity detector. The transmitter is configured to send a signal to the antenna. The coupler and the receiver are configured to receive and measure a signal at an antenna interface port. The return-loss-profile detector is configured to detect a return-loss-profile of the antenna and the correlator is configured to correlate the return-loss-profile to one or more known antenna signatures to obtain correlation coefficients. The correlation coefficients are compared with a threshold by the identity detector which identifies the correlation coefficient that is larger than the threshold.

Other embodiments comprise methods of identifying an antenna. A return-loss-profile of the antenna is first detected. The return-loss-profile comprises a frequency range including resonance frequency at which the return-loss is distinctively low. The return-loss-profile is correlated with one or more known antenna signatures to generate correlation coefficients. The correlation coefficients are compared to a threshold to identify the correlation coefficient that is larger than the threshold. The known antenna signature that is associated with the larger-than threshold correlation coefficient can be used as the antenna's unique signature.

In yet another embodiment, methods and apparatus for automatic remote detection of an antenna type are disclosed.

Of course, the present disclosure is not limited to the features, advantages, and contexts summarized above, and those familiar with antenna technologies will recognize additional features and advantages upon reading the following detailed description and upon viewing the accompanying drawings.

DETAILED DESCRIPTION

Figure 1:
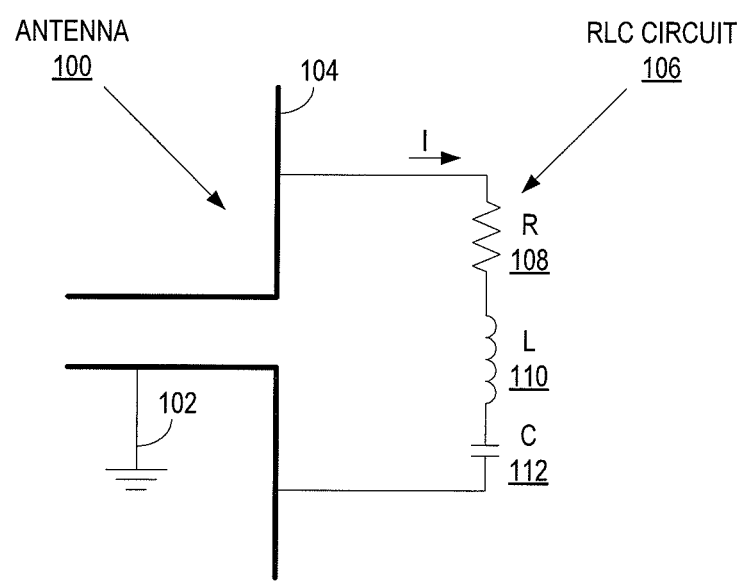
FIG. 1 illustrates an exemplary antenna configured with an RLC circuit.

In referring to the drawings, FIG. 1 illustrates an exemplary antenna 100 configured with an RLC circuit to generate a unique antenna signature. In FIG. 1, the antenna 100 comprises a ground element 102, a radiating element 104, and a RLC circuit 106. The ground element 102 is connected to the ground and the radiating element 104 is configured to transmit and receive signals. The RLC circuit 106 connects the ground element 102 and the radiating element 104.

The RLC circuit 106 in FIG. 1 is shown as a simple serial RCL circuit. As a person skilled in the art would know, the RLC circuit 106 can be replaced by other types of RLC circuits. The RLC circuit comprises a resistor 108, an inductor 110 and a capacitor 112. In the following discussion, the resistance of the resistor 108 is represented by R, the inductance of the inductor 110 is represented by L and the capacitance of the capacitor 112 is represented by C.

One of the well-known features of an RLC circuit is that in an RCL circuit, there is at least one resonance frequency $\omega_0$ at which the impedance of the RLC circuit is pure resistance. The resonance frequency of the RLC circuit 106 can be expressed as:

$$\omega_0 = 1/\sqrt{LC} \qquad (1).$$

In the RLC circuit 106, at the resonant frequency $\omega_0$, the impedance is reduced to resistance R, and the current and voltage are related as $V = I \cdot R$.

The voltage of the RLC circuit 106 changes in relation to the frequency of the input signal. At the resonance frequency $\omega_0$, the voltage reaches a peak and drops as the frequency of the input signal deviates from the resonance frequency $\omega_0$.

When at the resonance frequency $\omega_0$, it is important to limit the resonance current $I_0$ to protect the radio front end of the transceiver from being damaged by strong current. The resistor 108 provides the needed resistance R for limiting the current $I_0$. At the same time, the resistance R should be much less than the impedance of the antenna 100 to create a distinctively low return loss at the resonant frequency.

Figure 2:
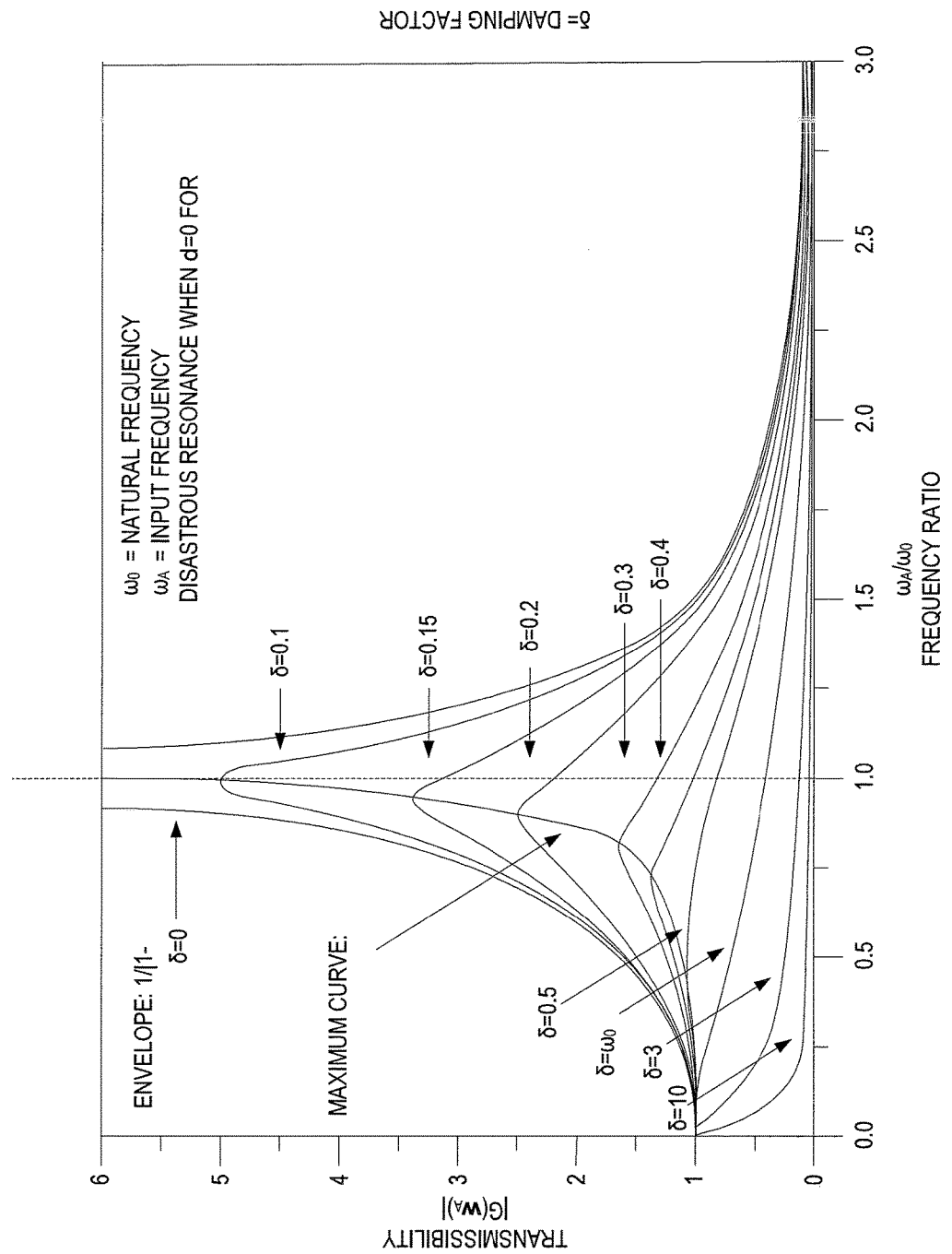
FIG. 2 illustrates an exemplary resonance transmissibility of an RLC circuit.

FIG. 2 depicts the relationship between the transmissibility of the RLC circuit 106, $|G(\omega_A)|$, and the frequency of the input signal $\omega_A$ scaled by the resonance frequency $\omega_0$. The relationship between $|G(\omega_A)|$ and $$\frac{\omega_A}{\omega_0}$$

is dependent upon the damping factor $\delta$, which can be expressed as $$\delta = \frac{R}{2}\sqrt{\frac{C}{L}}.$$

Both the damping factor $\delta$ and the resonance frequency $\omega_0$ are functions of parameters R, L, and C. Both can be determined from the frequency response curve of an antenna.

FIG. 2 illustrates 10 curves, each representing how $|G(\omega_A)|$ changes with $$\frac{\omega_A}{\omega_0}$$

for different damping factors $\delta$. As it is shown in FIG. 2, each curve exhibits a transmissibility peak at the resonance frequency $$\left(\frac{\omega_A}{\omega_0} = 1\right).$$

The smaller is the damping coefficient, the higher is the peak of the transmissibility curve. The return loss of the RLC circuit 106 is proportionally related to its transmissibility. Therefore, at the resonance frequency $\omega_0$, the RLC circuit 106 reaches its peak return loss for any damping coefficient. If a frequency swept signal is input into the antenna 100 in FIG. 1, the RLC circuit 106 will exhibit a signature return loss profile that peaks at the resonance frequency $\omega_0$. Although a frequency response curve does not provide enough information to allow the values of R, L, and C in the RLC circuit of the antenna to be ascertained, the frequency response of an antenna can be used to determine the damping factor $\delta$ and the resonance frequency $\omega_0$ of the antenna. Each type of antennas can be marked with a unique $\omega_0$. If $\omega_0$ is carefully selected to be located outside the working bandwidth of the antenna 100, such signature return loss profile can be used as the antenna 100's unique signature for identification purposes.

Antenna manufacturers can equip each type of antennas with a different RLC circuit having a distinctive resonance frequency and frequency response. Therefore, antennas of the same type exhibit the same return-loss profile and antennas of different types possess different return-loss profiles. By measuring an antenna's return-loss profile, the type of the antenna 100 can be identified. It should be noted that in the present application, the type of an antenna may include information such as the model, the maker, and/or the brand of the antenna.

Figure 3:
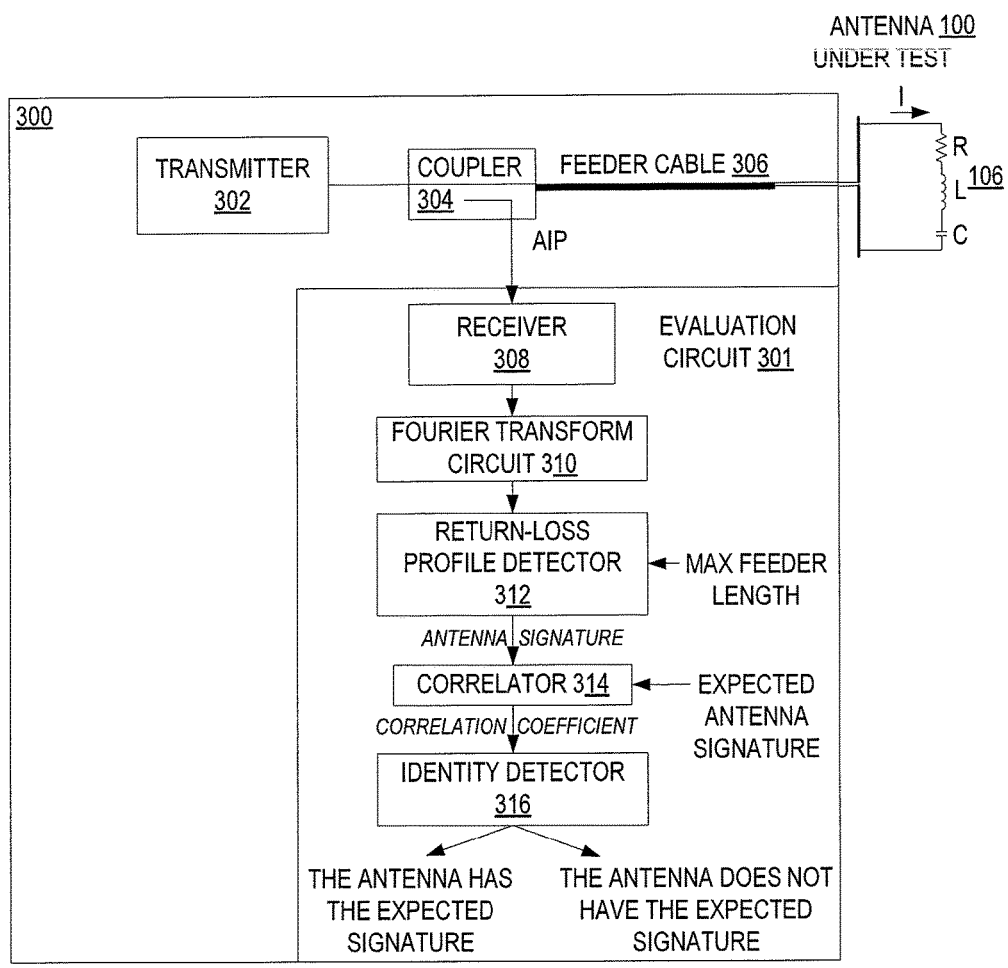
FIG. 3 illustrates an exemplary apparatus for detecting an antenna's unique electronic signature.

FIG. 3 illustrates an exemplary testing device 300 for measuring the return loss profile of the antenna 100 and for identifying the antenna 100 based on the measured return loss profile. In FIG. 3, the testing device 300 comprises a transmitter 302, a coupler 304 and an evaluation circuit 301. The transmitter 302 is connected to the coupler 304 and is configured to send signals to the antenna via the coupler 304 through a feeder cable. The evaluation circuit 301 comprises a receiver 308, a Fourier Transform circuit 310, a return-loss profile detector 312, a correlator 314, and an identity detector 316.

The receiver 308 receives and measures a signal received at an Antenna Interface Port (AIP) on the coupler 304. The receiver 308 comprises RF processing components, such as filter, amplifier, oscillator and analog to digital converter, to convert a received signal into baseband signals. The Fourier Transform Circuit 310 separates the different frequency components in the output signal and they are sent to the return-loss profile detector 312 for detecting a return-loss profile of the antenna. As the test signal travels through the feeder cable 306, the test signal exhibits variations over frequency. The variation period is related to the length of the feeder cable 306. With the knowledge of the maximum feeder length, the return-loss profile detector can smooth the variations over frequency introduced by the feeder cable.

Figure 4:
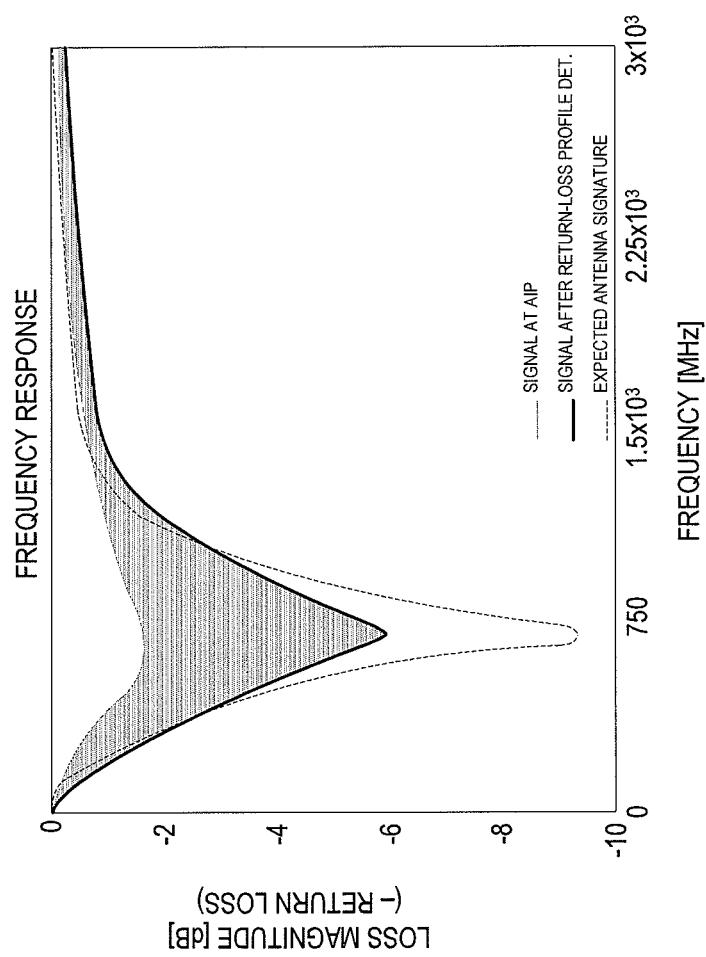
FIG. 4 illustrates an exemplary frequency response of an antenna configured with an RLC circuit to provide a unique electronic signature of the antenna.

The return-loss profile detected by the return-loss profile detector 312 is input into the correlator 314. The correlator 314 stores a list of known or expected antenna signatures. Such known antenna signatures are calculated a priori based on R, L, and C values or measured from known types of antennas. The expected antenna signatures are pre-calculated or pre-measured return-loss profiles of antennas of known origin or identity. The correlator 314 compares the return-loss profile of the antenna 100 with one or more of the known antenna signatures in the stored list. As shown in FIG. 4, the return-loss profile of the antenna 100 usually does not match known antenna signature perfectly, if the latter was calculated from R, L, and C values. The correlator 314 calculates a correlation coefficient for each of the known antenna signatures. The one or more correlation coefficients are sent to the identity detector 316. The identity detector 316 identifies the unique antenna signature of the antenna based on the one or more correlation coefficients.

The identity detector 316 may be implemented with different algorithms to identify the antenna's unique antenna signature. In some embodiments, the identity detector 316 is configured to select the known antenna signature that generates the largest correlation coefficient as the antenna's unique antenna signature.

In other embodiments, the correlator 314 may select one known antenna signature from the stored list and generates one correlation coefficient. The correlation coefficient is sent to the identity detector 316 which compares the correlation coefficient to a threshold. The threshold may be pre-calibrated and carefully selected such that it can be stated with high confidence that the known signature is the antenna's signature if the correlation coefficient is higher than the threshold. The correlation coefficient is compared to a threshold. If the correlation coefficient is smaller than the threshold, the return-loss profile is correlated with another known signature to generate another correlation coefficient. If the correlation coefficient is larger than the threshold, the known signature is considered to the antenna signature.

FIG. 4 illustrates an exemplary return-loss profile of the antenna 100 and its antenna signature calculated from R, L, and C values. FIG. 4 is a frequency response diagram showing how the loss magnitude (dB) varies with the input frequency. The loss magnitude is defined as: loss magnitude=−return loss. The fine solid curve represents the input signal with a frequency ranging from 0 to $3 \times 10^3$ MHz. The heavy solid curve represents the return-loss profile of the antenna 100 with a resonance frequency $\omega_0$=700 MHz. The dotted curve represents the pre-calculated antenna signature.

Figure 5:
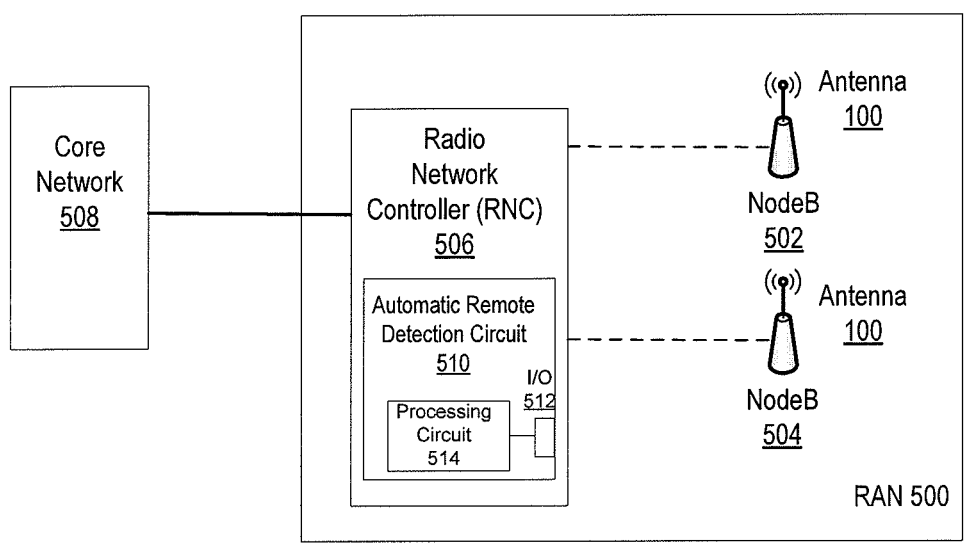
FIG. 5 illustrates an exemplary system configured for automatic remote detection of an antenna type.

FIG. 5 illustrates an exemplary system configured to perform an automatic remote detection of the type of the antenna 100. In FIG. 5, a radio access network 500 is connected to a core network 508. The radio access network 500 comprises two NodeB's 502 and 504 and a Radio Network Controller (RNC) 506. The NodeBs 502 and 504 are connected to the RNC 506, which is connected to the core network 508. An antenna 100 is installed in the NodeB 502 and the NodeB 504 respectively. The RNC 506 includes an automatic remote detection circuit 510 which comprises an I/O device 512 and a processing circuit 514. To identify the type of the antennas 100, the processing circuit 514 can send a signal through the I/O device 512 to remotely activate the evaluation circuit 301 (in FIG. 3). The antenna signature detected by the identity detector 316 and/or the type determined based on the antenna signature can be sent to the automatic remote detection circuit as result.

It should be noted that the automatic remote detection circuit 510 may also reside in the core network 508 or in a mobile device (not shown). In the latter case, the automatic detection circuit activates the evaluation circuit 301 via a radio air interface. In FIG. 5, the antenna 100 is shown to be installed in a NodeB.

Figure 6:
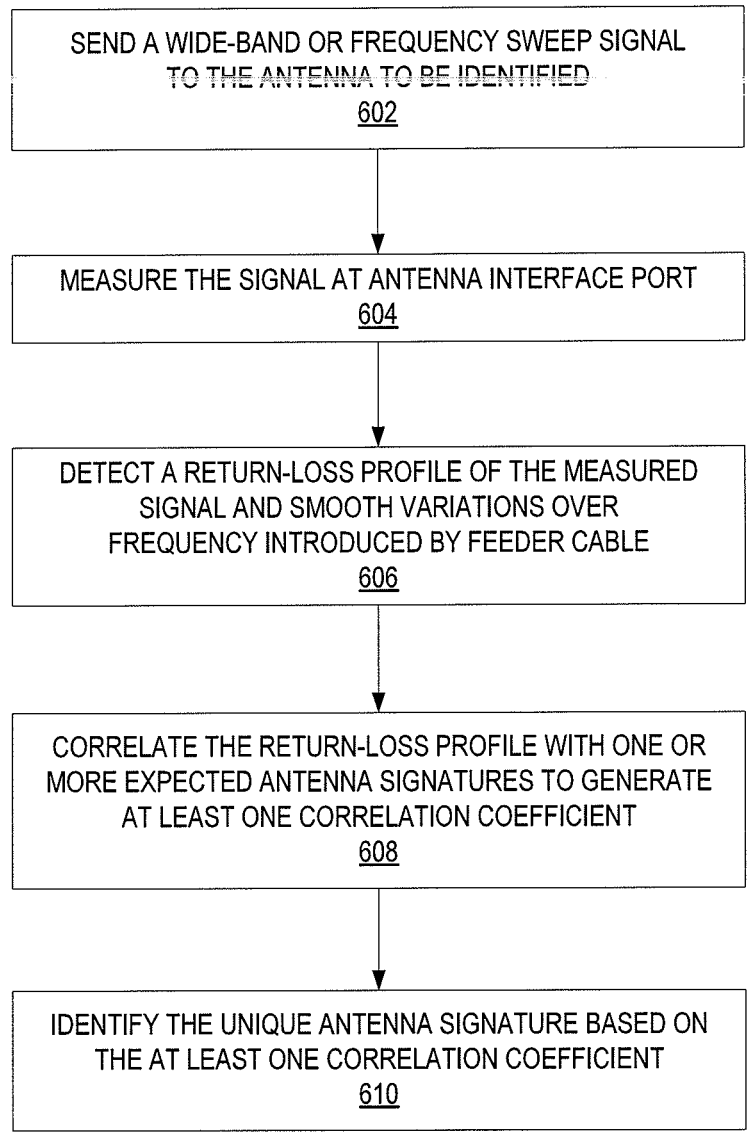
FIG. 6 illustrates a flow chart of an exemplary process for identifying an antenna's unique signature.

FIG. 6 illustrates a flow chart of an exemplary process for identifying an antenna 100 using the advantageous methods disclosed herein. The process starts with sending a wideband or frequency sweep signal to the antenna 100 to be identified (step 602). The signal is measured at the antenna interface port (AIP) (step 604) and its return-loss profile of the measured signal is detected (step 606). The detected return-loss profile is correlated with an expected or known antenna signature to generate at least one correlation coefficient (step 608). Based on the at least one correlation coefficient, the antenna's unique antenna signature is identified (step 610).

Methods and apparatus disclosed herein are applicable to any type of antennas, for example, antennas installed on any wireless communication devices, such as base stations, NodeBs, repeaters, etc., and antennas used for purposes other than wireless communications.

The foregoing description and the accompanying drawings represent non-limiting examples of the methods and apparatus taught herein. As such, the present invention is not limited by the foregoing description and accompanying drawings. Instead, the present invention is limited only by the following claims and their legal equivalents.

What is claimed is:

1. A method of automatic remote detection of a type of an antenna, said antenna configured with a resistor-inductor-capacitor (RLC) circuit generating a return-loss profile that serves as an antenna signature of the antenna, said method implemented by an automatic remote detection device of a Radio Network Controller (RNC), the method comprising:
   remotely activating, for each antenna of a plurality of antennas, each antenna being installed in a respective NodeB connected to the RNC, an evaluation circuit in the antenna to automatically determine the antenna signature of the antenna; and
   determining the type of the antenna identified based on the antenna signature.

2. An automatic remote detection device for detecting a type of an antenna remotely, said antenna configured with a resistor-inductor-capacitor (RLC) circuit generating a return-loss profile that serves as an antenna signature of the antenna, said automatic remote detection device being configured to be included in a Radio Network Controller (RNC), the automatic remote detection device comprising:
   an input/output for sending, for each antenna of a plurality of antennas, each antenna being installed in a respective NodeB connected to the RNC, a signal to activate an evaluation circuit in the antenna to automatically determine the antenna signature of the antenna and for receiving a result from the evaluation circuit; and
   a processing circuit for determining the type of the antenna based on the antenna signature.

* * * * *